(12) United States Patent
Syed et al.

(10) Patent No.: US 8,912,051 B1
(45) Date of Patent: Dec. 16, 2014

(54) METHOD FOR CONTROLLING MOLDING COMPOUND GEOMETRY AROUND A SEMICONDUCTOR DIE

(75) Inventors: Ahmer Syed, Chandler, AZ (US); Miguel Jimarez, Gilbert, AZ (US); Jeff Watson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 13/564,567

(22) Filed: Aug. 1, 2012

(51) Int. Cl.
*H01L 21/00* (2006.01)
*H01L 23/28* (2006.01)

(52) U.S. Cl.
USPC ........... 438/127; 257/787; 438/106; 438/112; 438/124; 438/126

(58) Field of Classification Search
None
See application file for complete search history.

(56) References Cited

U.S. PATENT DOCUMENTS

| | | | |
|---|---|---|---|
| 2002/0088632 A1* | 7/2002 | Salatino et al. | 174/52.1 |
| 2003/0156743 A1* | 8/2003 | Okada et al. | 382/124 |
| 2004/0241905 A1* | 12/2004 | Hundt et al. | 438/106 |

* cited by examiner

*Primary Examiner* — Mamadou Diallo
*Assistant Examiner* — Jay C Chang
(74) *Attorney, Agent, or Firm* — McAndrews, Held & Malloy

(57) ABSTRACT

A novel die seal design, and method for utilization thereof, controls contact of a mold material with the surfaces of a semiconductor die during application, reducing stresses due to a mismatch of the coefficient of thermal expansion of the mold material and the semiconductor die, thereby reducing cracking of the semiconductor die, resulting in increased yields and lower costs, and permits reuse of elements of a mold tool over a range of die sizes.

20 Claims, 17 Drawing Sheets

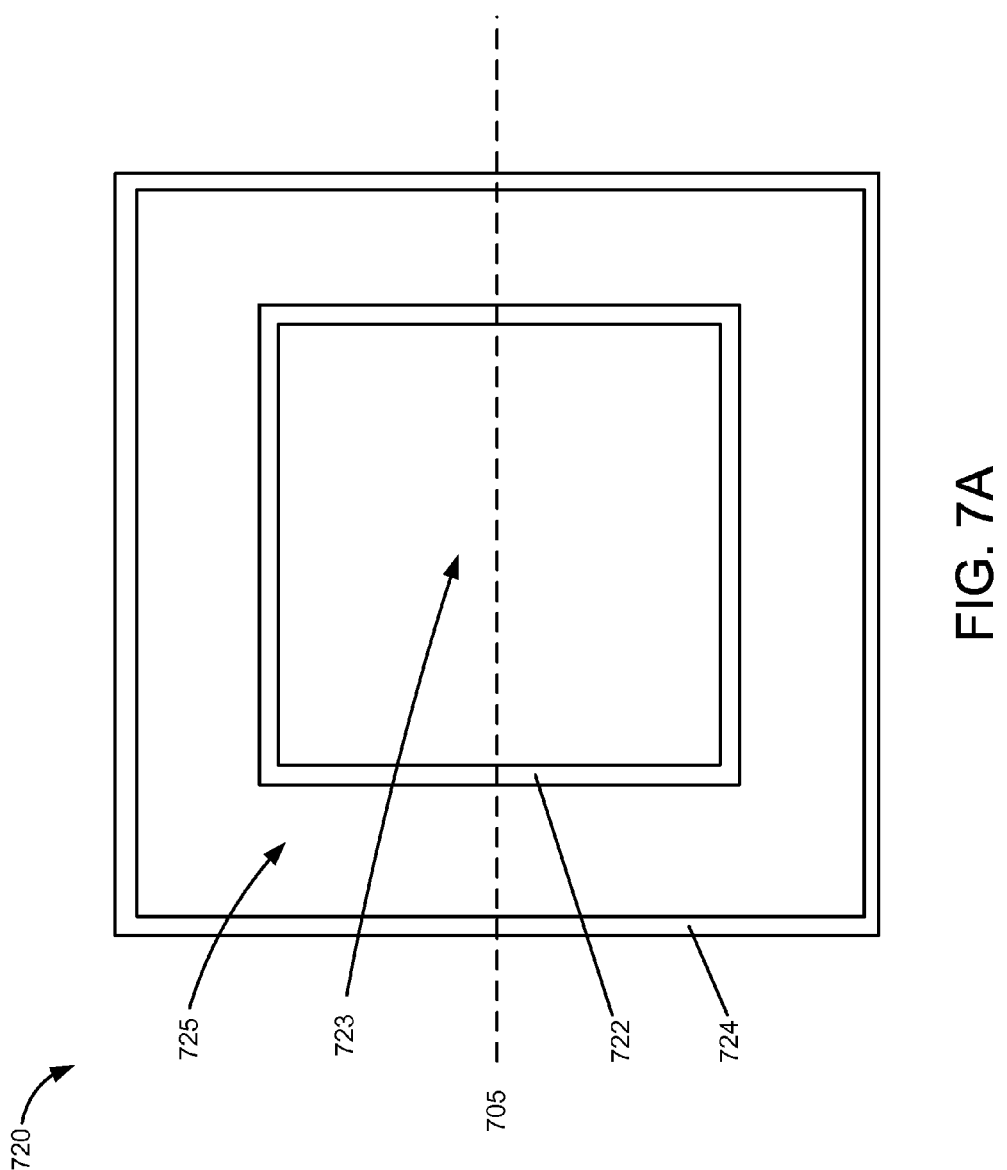

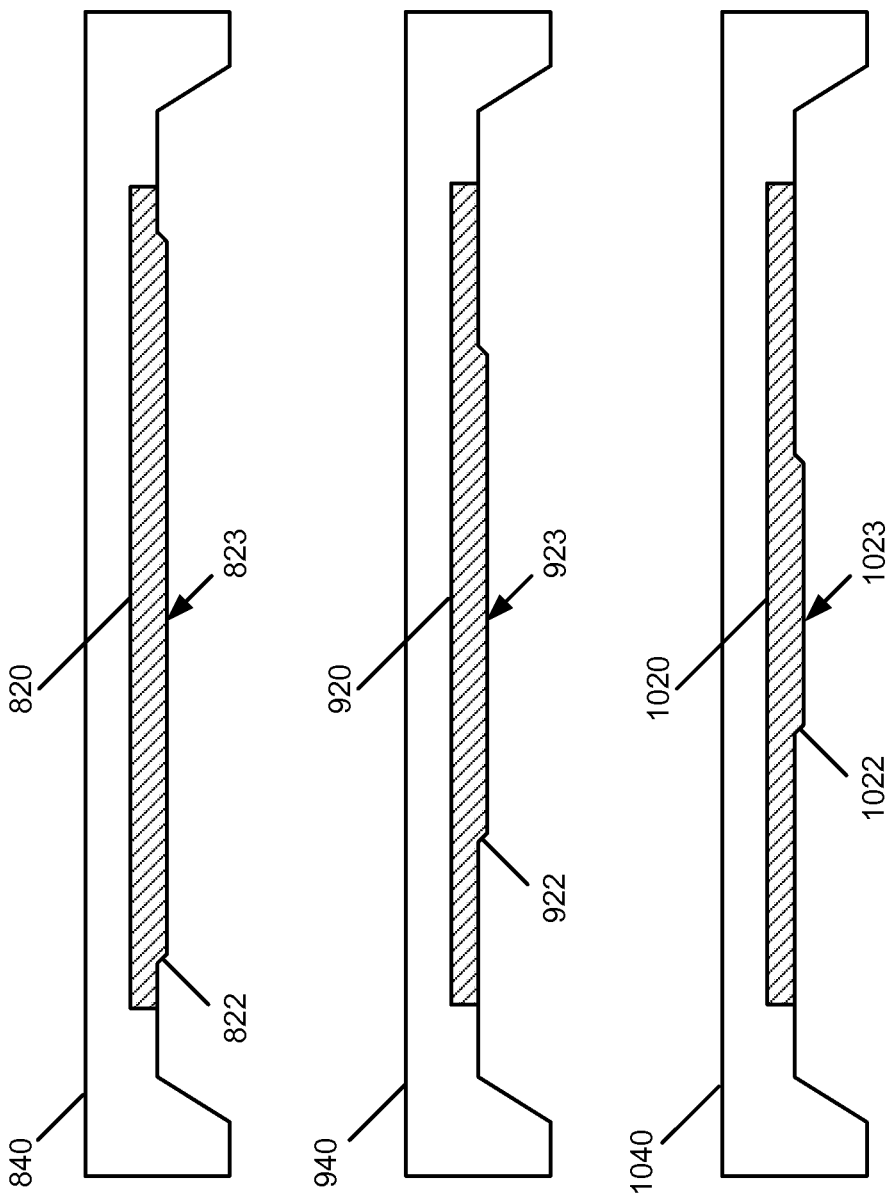

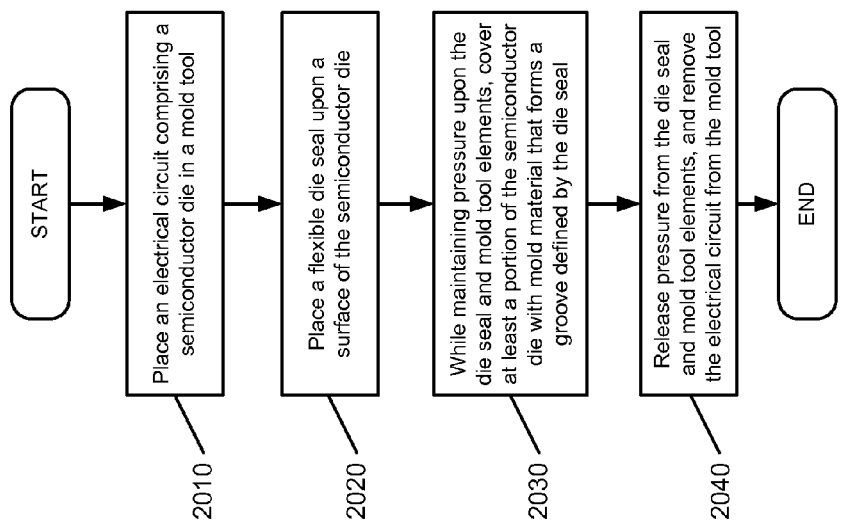

METHOD FOR CONTROLLING MOLDING COMPOUND GEOMETRY AROUND A SEMICONDUCTOR DIE

CROSS-REFERENCE TO RELATED APPLICATIONS/INCORPORATION BY REFERENCE

N/A

FIELD OF THE INVENTION

The present invention, for example, relates to a die seal, and method for utilization thereof, used to protect die surfaces from contact with molding compound during packaging of an integrated circuit die.

BACKGROUND OF THE INVENTION

A die seal is a layer of flexible material that is pressed against a surface of an integrated circuit die prior to covering of portions of the die in a molding compound. The die seal is removed from contact with the die after application of the molding compound is complete. The die seal restricts the flow of the molding compound during packaging in order to block flow of the mold material onto particular portions of the die surface.

Further limitations and disadvantages of conventional and traditional approaches will become apparent to one of skill in the art, through comparison of such systems with some aspects of the present invention as set forth in the remainder of the present application with reference to the drawings.

BRIEF DESCRIPTION OF SEVERAL VIEWS OF THE DRAWINGS

FIG. 7A shows a schematic view of the underside or lower surface of an exemplary die seal comprising a lower seal surface having a raised seal surface that protrudes from the lower seal surface, in accordance with a representative embodiment of the present invention.

FIG. 8 illustrates a cross section view of an exemplary die seal, and a mold tool element such as, for example, the middle layer of FIG. 1, in accordance with a representative embodiment of the present invention.

FIG. 9 illustrates a cross section view of another exemplary die seal, and a mold tool element that may correspond to, for example, the mold tool element of FIG. 8, in accordance with a representative embodiment of the present invention.

FIG. 10 illustrates a cross section view of yet another exemplary die seal and a mold tool element that may correspond to, for example, the mold tool elements of FIG. 8 and FIG. 9, in accordance with a representative embodiment of the present invention.

FIG. 20 is a flowchart illustrating an exemplary method of applying mold material to a semiconductor die of an electrical circuit, in accordance with a representative embodiment of the present invention.

DETAILED DESCRIPTION OF THE INVENTION

Figure 1:
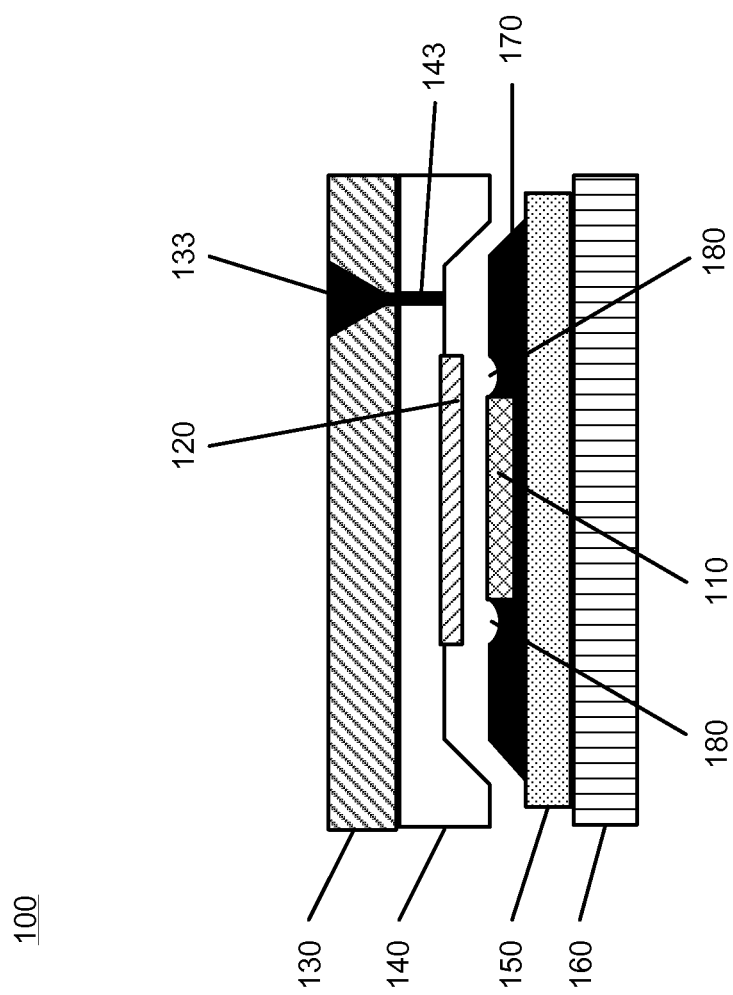
FIG. 1 is a schematic view of an exemplary mold tool, having a flexible flat die seal used to protect the upper surface of an exposed die during the covering or encapsulation step of packaging.

Aspects of the present invention relate to die seals used to protect a surface of a semiconductor die from mold material used to cover at least a portion of the die during packaging of the semiconductor die. More specifically, representative embodiments of the present invention relate to a die seal arrangement that reduces manufacturing cost while reducing stresses in the semiconductor die by permitting the use of any of a number of lower cost die seals corresponding to a specific die size, in a single higher cost part of the mold tool.

Semiconductor die are covered or encapsulated in mold material, which may also be referred to herein as mold compound, for a variety of reasons, for example, to protect die connections, to protect the die from general mechanical forces, to provide a base for electrical connection fanout, to provide a base for mounting a heat sink, to control warpage of the semiconductor die and/or overall integrated circuit package, etc. A difference in the thermal coefficient of expansion of the semiconductor die and the mold material creates stresses in the semiconductor die at the side faces, leading to cracking of the semiconductor die, reducing yields and raising production costs.

Currently, an approach referred to herein as "undercut" or "UC" is being explored as a means to control/reduce the stresses that appear at the "die to mold" surface. Undercut is a side effect of the use, during covering or encapsulation of the semiconductor die, of a flat die seal that is larger than the surface of the semiconductor die surface onto which the die seal is compressed, in an effort to ensure a mold free top surface of the semiconductor die. When a flat die seal is pressed against the top surface of the semiconductor die, any portion of the die seal that extends beyond the edges of the top surface of the semiconductor die tends to bulge in the direction of the force placed upon the die seal, creating a semi-circular convex shape. As the mold material flows into the tool used to cover or encapsulate the semiconductor die, the convex shape of the bulging die seal extension, which partially defines the shape of the cavity formed by the mold tool, causes the mold material to take on a concave semi-circular shape along the sides of the semiconductor die. Analysis has shown that high stresses appear in the middle of the semiconductor die, which is where cracks in the semiconductor die initiate.

Representative embodiments of the present invention relate to crack-related reliability issues in what are referred to herein as FCmBGA (Flip-Chip molded Ball Grid Array) packages. One representative embodiment of the present invention may be seen in a design for a flexible die seal having one face with a raised portion corresponding to the dimensions of one face of a semiconductor die of a particular size, and having an opposing face sized to mount to an element of a mold tool used for covering or encapsulation of a range of different sizes of semiconductor die. This unique structure permits a single, relatively higher-cost part of a mold tool to be used over a range of semiconductor die sizes, by simply fabricating a matching relatively lower-cost die seal part specifically designed for each die size, which results in a significant cost savings.

FIG. 1 is a schematic view of an exemplary mold tool 100, having a flexible flat die seal 120 used to protect the upper surface of an exposed die 110 during the covering or encapsulation step of packaging. As illustrated in FIG. 1, the mold tool 100 comprises an upper chase 130, a middle plate 140 (also referred to herein as the middle layer 140 and/or the middle chase 140) to which the die seal 120 is mounted, and a lower chase 160. The semiconductor die 110 is shown mounted to a substrate 150, which is resting on the lower chase 160. During the operation of packaging, downward pressure on the upper chase 130 causes the middle plate 140 to bear down upon the substrate 150, clamping the substrate against the lower chase 160 and closing the mold tool 100. The downward movement causes flexible die seal 120 to press down upon the semiconductor die 110, protecting the upper surface of the semiconductor die 110 from the mold material used to cover parts of the semiconductor die 110, which enters the cavity of the mold tool 100 via molding gate elements 133/143 in the upper chase 130 and the middle layer 140, respectively.

The pressure of the middle plate 140 upon the flexible material of the die seal 120 deforms the portions of the die seal 120 that extend beyond the upper surface of the semiconductor die 110, forming a downward bulge at each edge of the semiconductor die 110, which results in a groove 180 in the mold material 170 that borders each side face of the semiconductor die 110. The mold material 170 is shaped by the boundaries formed by the side faces of the semiconductor die 110, the die seal 120, the middle plate 140, and the substrate 150. After an appropriate amount of time, pressure upon the upper chase 130 is removed, the upper chase 130 and middle chase 140 are moved away from the substrate 150 and the lower chase 160, and the substrate 150 with the semiconductor die 110 covered in mold material 170 is then removed from the mold tool 100. The process may then be repeated.

It should be noted that although FIG. 1 shows a single mold tool 100, the elements of the mold tool 100 described above may be part of a larger apparatus having multiple cavities each with respective upper chase, middle layer, and lower chase elements, for applying mold material to multiple die/substrate assemblies in a single operation, without departing from the spirit or scope of the present invention. Also for example, the elements of the mold tool 100 may be part of a larger apparatus having a single cavity into which a plurality of die are molded as a single system-in-package, for example each die having a respective die seal disposed in the mold tool 100. Additionally for example, the elements of the mold tool 100 may be part of a larger apparatus having a single cavity into which a plurality of independent die are molded in a mass-molding (or gang-molding) fashion and later singulated into single packages. In such multi-die configurations, such molding may for example be performed using a single continuous seal having a set of seal features as discussed herein (e.g., a single set of seal features for all of the plurality of die and/or a respect set of seal features for each of the plurality of die), or may for example be performed using a plurality of seals, one for each respective die, and each having a respective set of seal features as discussed herein.

Figure 2:
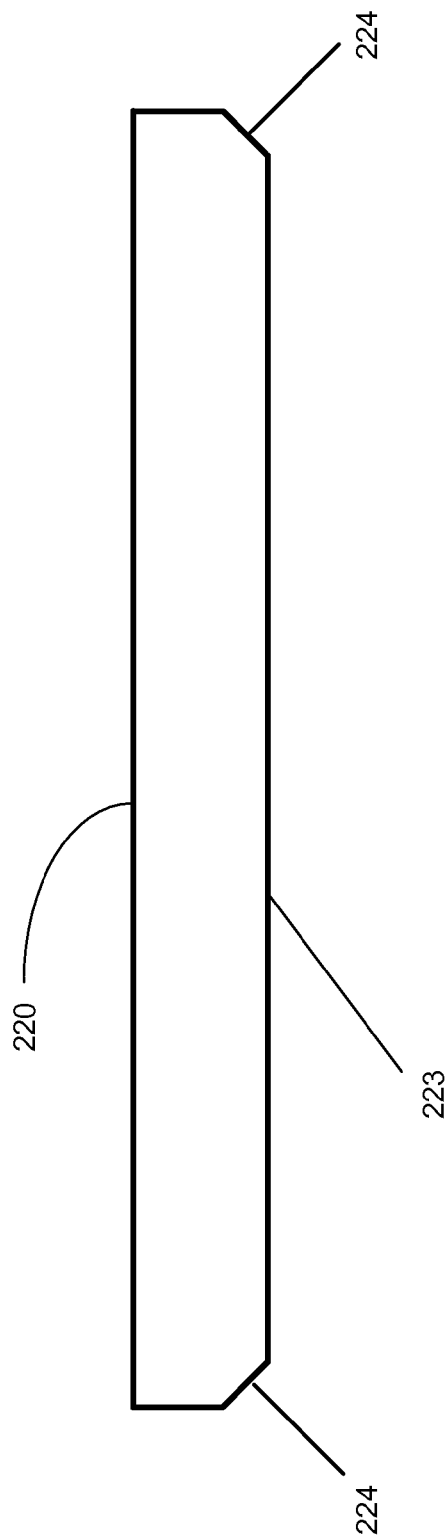
FIG. 2 is an illustration of a side view of a flat die seal that may correspond to, for example, the die seal of FIG. 1.

FIG. 2 is an illustration of a side view of a flat die seal 220 that may correspond to, for example, the die seal 120 of FIG. 1. The die seal 220 may be fabricated using, for example, a silicon rubber material such as Softec™ available from ASM (http://www.asm.com/). The die seal 220 of FIG. 2 is shown as having a flat lower surface 223, which is used to block flow of mold material onto the upper surface of a semiconductor die, and chamfers 224, which may be used to help retain the die seal 220 in a mating recess or pocket in a mounting such as, for example, the middle plate 140 of FIG. 1, or another element of an apparatus that performs packaging function similar to that of mold tool 100 of FIG. 1. It should be noted that the chamfers 224 shown in FIG. 2 and other illustrations shown herein are for illustrative purposes only, and do not necessarily represent a specific limitation of the inventive concepts discussed herein, for example unless explicitly claimed.

Figure 3:
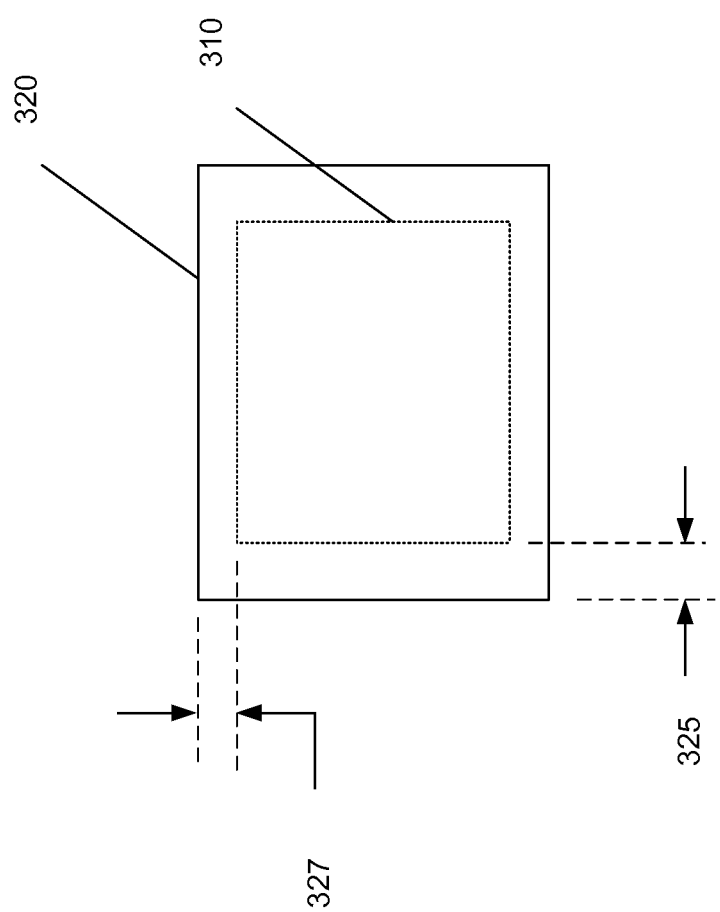
FIG. 3 is an illustration of a top view of a die seal aligned over a corresponding semiconductor die, illustrating the extension of the die seal beyond the edge of the semiconductor die, which creates an X-overhang and a Y-overhang that results in an undercut in the mold material injected during covering or encapsulation.

FIG. 3 is an illustration of a top view of a die seal 320 aligned over an corresponding semiconductor die 310, illustrating the extension of the die seal 320 beyond the edge of the semiconductor die 310, which creates an X-overhang 325 and a Y-overhang 327 that results in an undercut in the mold material injected during covering or encapsulation. As shown in FIG. 3, the extension of the die seal 320 beyond the edge of the semiconductor die 310 forms an X-overhang 325 and Y-overhang 327. The amount of overhang in the X and Y dimensions is a factor that determines the amount and shape of the deformation of the die seal 320 upon application of pressure upon the die seal 320 when in contact with the semiconductor die 310. In the example of FIG. 3, the size of the semiconductor die 310 may be, for example, 14 millimeters in the X-dimension and 12 millimeters in the Y-dimension, and the die seal 320 may be 21 millimeters in the X-dimension and 16 millimeters in the Y-dimension, resulting in an X-overhang 325 of 3.5 millimeters and a Y-overhang 327 of 2 millimeters.

Figure 4:
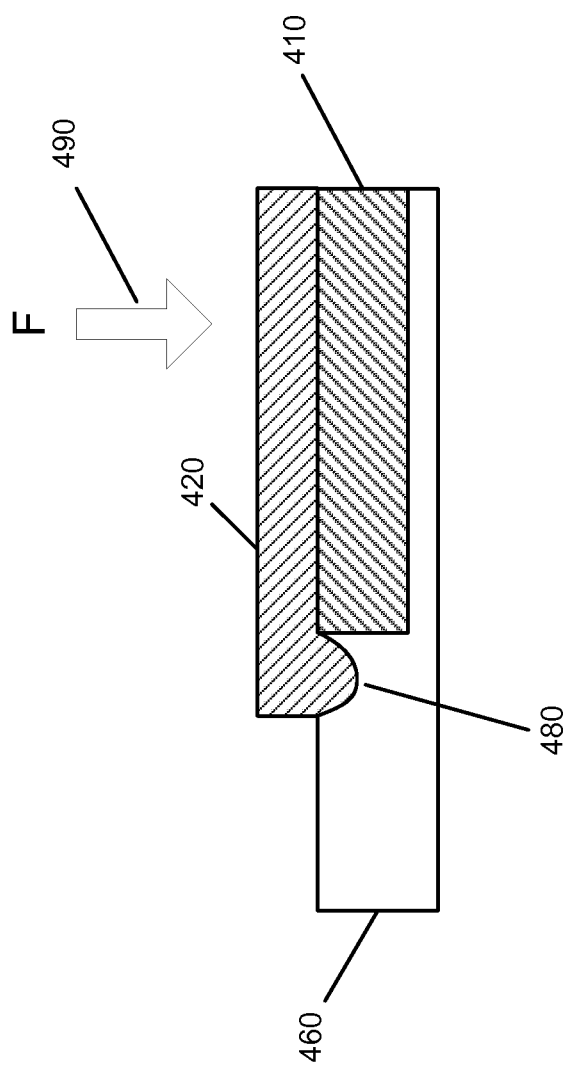
FIG. 4 is a cut-away view of a die seal compressed by a downward force F applied uniformly upon the upper surface of the die seal applied to a surface of a semiconductor die causing deformation of the overhang of the die seal.

FIG. 4 is a cut-away view of a die seal 420 compressed by a downward force F 490 applied uniformly upon the upper surface of the die seal 420 applied to a surface of a semiconductor die 410 causing deformation 480 of the overhang of the die seal 420. As shown in the illustration of FIG. 4, a bulge 480 that forms in the die seal 420 results in a corresponding groove in the mold material 460 that flows into the space surrounding the semiconductor die 410 during the application of the mold material to the semiconductor die 410 within the cavity of a mold tool such as mold tool 100, for example. The groove in the mold material 460 formed caused by the bulge 480 results in a thinning of the mold material 460 as it flows into the space between the bulge 480 in the die seal 420 and the side of the semiconductor die 410. The thinning of the mold material 460 in the region surrounding the semiconductor die 410 reduces stresses at the mold material/die interface caused by a mismatch in the coefficient of thermal expansion (CTE) of the mold material 460 and the semiconductor die 410.

Figure 5:
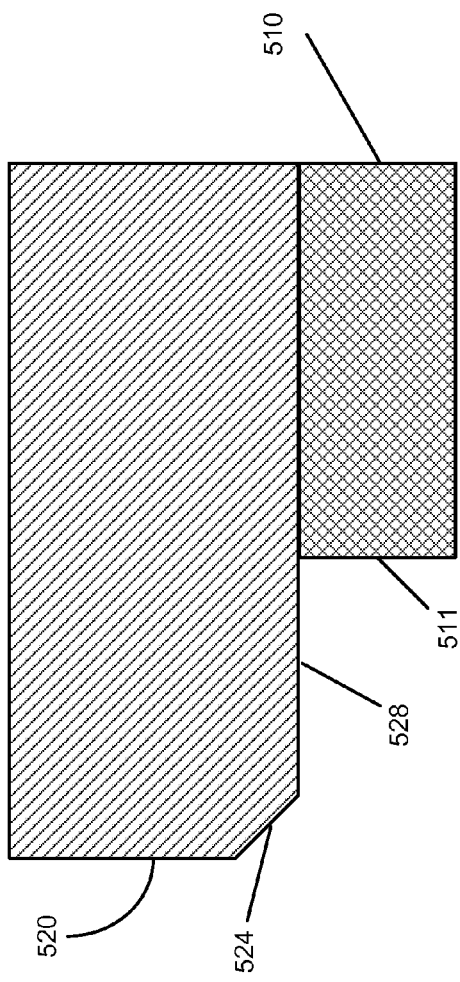
FIG. 5 shows an enlarged half-cross section view of a die seal in contact with a semiconductor die, prior to application of the downward pressure upon the die seal during the process of covering or encapsulating the die.

FIG. 5 shows an enlarged half-cross section view of a die seal 520 in contact with a semiconductor die 510, prior to application of the downward pressure upon the die seal 520 during the process of covering or encapsulating the die 510. The die seal 520 comprises a chamfer 524, which may be used to aid in retention of the die seal 520 within a part of a mold tool, such as the middle chase 140 of FIG. 1, described above. As shown in FIG. 5, and as previously discussed, the material of the die seal 520 may extend beyond the side face 511 of the semiconductor die 510, to form an overhang 528.

Figure 6:
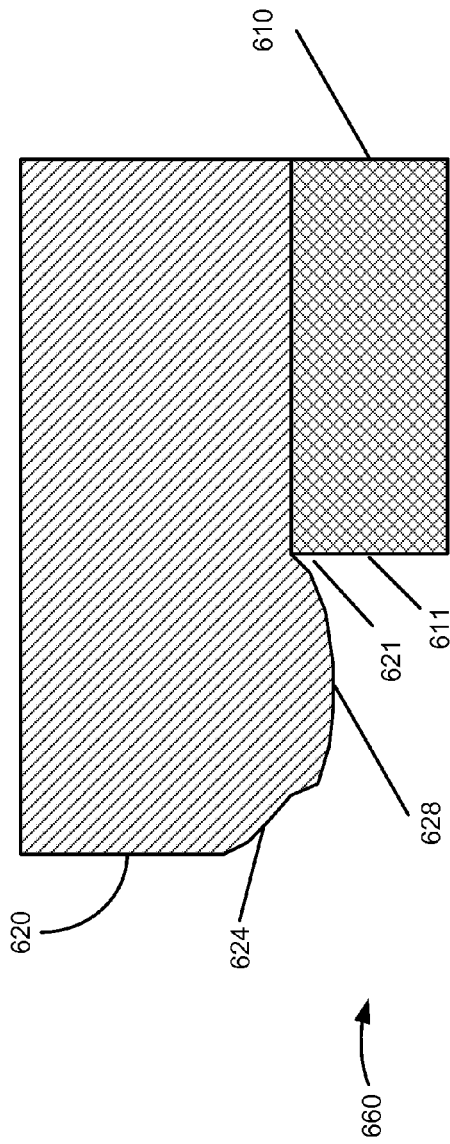
FIG. 6 shows an enlarged half-cross section view of a die seal in contact with a corresponding semiconductor die that may correspond to, for example, the die seal and semiconductor die of FIG. 5, respectively, following application of downward pressure that presses the die seal into contact with the semiconductor die to prevent leakage of mold material onto the upper surface of the semiconductor die.

FIG. 6 shows an enlarged half-cross section view of a die seal 620 in contact with a corresponding semiconductor die 610 that may correspond to, for example, the die seal 520 and semiconductor die 510 of FIG. 5, respectively, following application of downward pressure that presses the die seal 620 into contact with the semiconductor die 610 to prevent leakage of mold material onto the upper surface of the semiconductor die 610. The illustration of FIG. 6 is based upon analysis by the applicant using a finite element model (FEM). As illustrated in FIG. 6, the FEM predicts that downward pressure upon the die seal 620 will result in a distortion of the flexible material of the die seal 620 affecting the chamfer 624, and producing a bulge 628 in the die seal 620. As discussed above, the bulge 628 acts to restrict or control the flow of mold material as it approaches the semiconductor die 610, so that the mold material forms a groove the runs generally parallel to the side face 611 of the semiconductor die 610 (in a direction perpendicular to the page of the illustration), and causes thinning of the mold material as it nears the corner 621 of the semiconductor die 610. The thinning of the mold material in the region near the side face 611 of the semiconductor die 610 results in a reduction in thermal stresses upon the side face 611 of the semiconductor die 610, that reduces cracking of the semiconductor die 610.

A representative embodiment of the present invention may be seen in a die seal design, which uniquely allows the mold material to control warpage of the semiconductor die while significantly reducing the stresses along the sides of the semiconductor die, while also resulting in a lower manufacturing cost. The reduction in manufacturing cost provided by a representative embodiment of the present invention is accomplished through the use of a die seal having a raised portion dimensioned to cover the exposed surface of semiconductor die of a limited range of sizes, and having a mounting surface designed to fit a portion of an enclosing mold tool used for covering or encapsulation of semiconductor die of many different sizes. In a representative embodiment of the present invention, the raised portion of the die seal may extend above the surrounding die seal material by, for example, an amount in the range of about 50 μm to about 100 μm, and the projection of the raised portion beyond the surrounding die seal material may be chosen so that the die seal material surrounding the raised portion is at approximately the same height as the surface of the semiconductor die, when the raised portion is compressed during the molding process.

FIG. 7A shows a schematic view of the underside or lower surface of an exemplary die seal 720 comprising a lower seal surface 725 having a raised seal surface 723 that protrudes from the lower seal surface 725, in accordance with a representative embodiment of the present invention. The die seal 720 shown in FIG. 7A shows a step or transition portion 722, which defines, bounds or distinguishes the lower seal surface 725 from the raised portion of the die seal 720 shown as the generally flat raised seal surface 723, which is used for covering and protecting a corresponding surface of a semiconductor die such as, for example, the semiconductor die 110 of FIG. 1, from mold material applied to the semiconductor die during packaging. In addition, FIG. 7A illustrates a chamfer 724 which may be used to aid retention of the die seal 720 in an element of a mold tool such as, for example, mold tool 100 of FIG. 1. In accordance with a representative embodiment of the present invention, the slope of the transition portion 722 may be, for example, in a range of about 30 degrees to about 60 degrees, and may be adjusted to create the desired groove geometry during the compression cycle. It should be noted that the chamfer 724 of FIG. 7A does not necessarily represent a specific limitation of a representative embodiment of the present invention, for example unless explicitly claimed. In accordance with a representative embodiment of the present invention, the raised seal surface 723 of the die seal 720 is designed for use with semiconductor die of a certain relatively smaller range of dimensions, while the geometry of the upper portion of the die seal 720, including that of an upper surface (not shown), is arranged to fit compatibly with a common element of a mold tool such as, for example, the middle plate 140 of mold tool 100 of FIG. 1. In a representative embodiment of the present invention, the common element of the mold tool may be suitable for packaging semiconductor die of a range of sizes larger than the range of die sizes able to be packaged using any single die seal 720. The illustration of FIG. 7A also shows a reference line 705, which identifies the location of cross sections illustrated in FIGS. 8-14, 18, and 19, which will be described in detail, below.

Figure 7B:
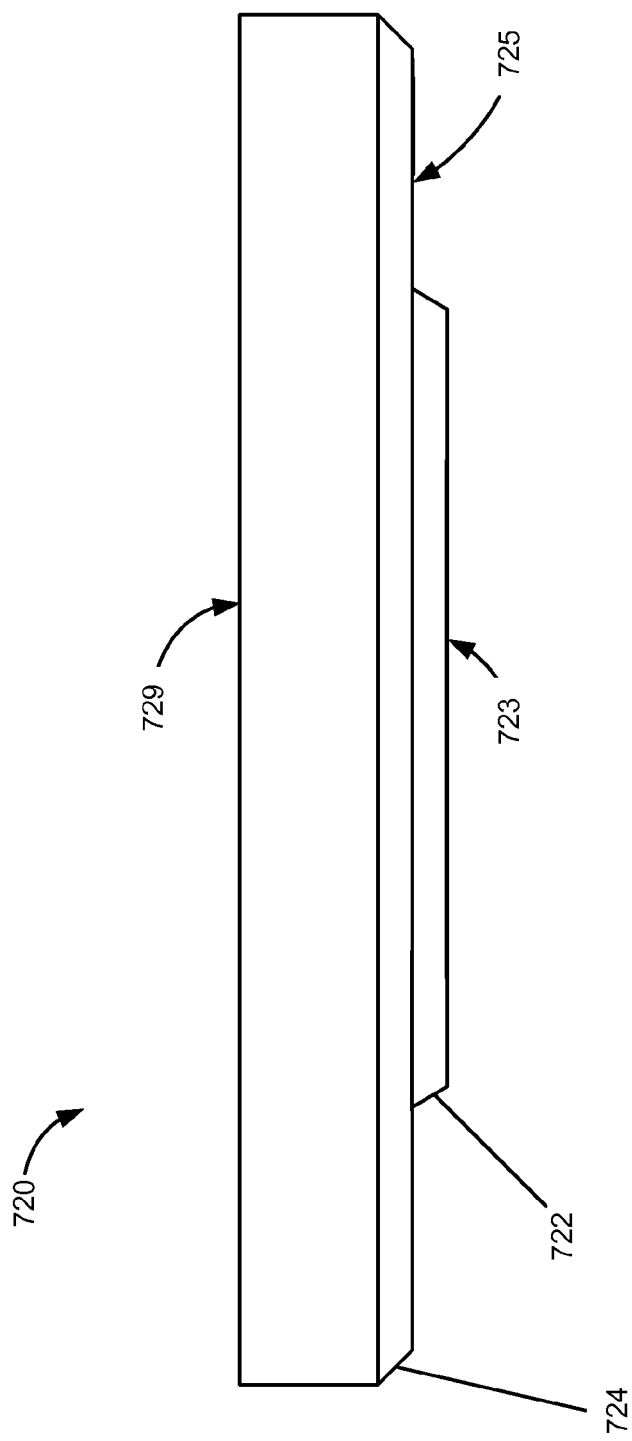
FIG. 7B shows a side view of an exemplary die seal having an upper seal surface and lower surface having a raised seal surface that may correspond to, for example, the die seal, the lower seal surface, and the raised seal surface of FIG. 7A, in accordance with a representative embodiment of the present invention.

FIG. 7B shows a side view of an exemplary die seal 720 having an upper seal surface 729 and lower surface 725 having a raised seal surface 723 that may correspond to, for example, the die seal 720, the lower seal surface 725, and the raised seal surface 723 of FIG. 7A, in accordance with a representative embodiment of the present invention. The die seal 720 shown in FIG. 7B shows an exemplary step or transition portion 722, which defines, bounds or distinguishes the lower seal surface 725 from the raised portion shown as the generally flat raised seal surface 723, which is used for covering and protecting a corresponding surface of a semiconductor die such as, for example, the semiconductor die 110 of FIG. 1, from the mold material applied to the semiconductor die during packaging. In a representative embodiment of the present invention, the width of the step or transition portion 722 may be relatively wider for a die seal 720 for use with a semiconductor die of a first size, and may be relatively smaller for a die seal 720 for use with a semiconductor die of a second size smaller than the first size. In addition, FIG. 7B illustrates a chamfer 724 that may correspond to the chamfer 724 of FIG. 7A, which may aid retention of the die seal 720 in a pocket or recess of an element of a mold tool such as, for example, mold tool 100 of FIG. 1. As noted above with respect to FIG. 7A, the chamfer 724 does not necessarily represent a specific limitation of a representative embodiment of the present invention, for example unless explicitly claimed, in that other means of controlling the position of the die seal in a mold tool may be employed without departing from the spirit and scope of the present invention. Also as previously noted, the raised seal surface 723 of the die seal 720 may be designed for use with semiconductor die of a certain relatively smaller range of dimensions, while the geometry of the upper portion of the die seal 720, including that of an upper surface 729, may be arranged to fit compatibly with a common element of a mold tool such as, for example, the middle plate 140 of mold tool 100 of FIG. 1. In a representative embodiment of the present invention, the common element of the mold tool may be suitable for packaging semiconductor die of a range of sizes larger than the range of die sizes able to be packaged using any single die seal 720.

As previously described above with respect to FIG. 1, during the covering or encapsulation of a semiconductor die, downward pressure applied to the die seal 720 while in contact with the top surface of a semiconductor die causes deformation of portions of the die seal 720 that extend beyond the top surface of the semiconductor die, creating a concave bulge that borders each edge of the covered or protected face of the semiconductor die. With respect to FIG. 7B, when mold material is injected into the cavity of the mold tool, the bulge or deformation of the die seal 720 acts to direct or control the flow of mold material, thereby controlling the geometry of the mold material in proximity to the side faces of the semiconductor die. At the same time, contact of the raised sealing surface 723 with the top surface of the semiconductor die minimizes or eliminates the presence of "mold flash" on the top surface of the semiconductor die.

By controlling the geometry of the mold material in the region of the side faces of the semiconductor die, a representative embodiment of the present invention controls the location and magnitude of the stresses placed upon the semiconductor die by any mismatch in the coefficient of thermal expansion of the semiconductor die and the surrounding mold material, reducing occurrence of cracking of the semiconductor die, and resulting in an increase in yield and a lower cost to manufacture. In order to produce a groove geometry that provides the desired stress reduction benefits, the deformation of the material of the die seal 720 preferably results in a groove depth in a range of about 50 µm to about 300 µm. In addition, the compression of the die seal 720 is preferably adjusted so that the top surface of the semiconductor die is either co-planar with or slightly above the lower surface 725, permitting the top surface of the semiconductor die to protrude slightly above the lower surface 725. In addition, the use of a die seal in accordance with a representative embodiment of the present invention permits reuse of a single, relatively more expensive mold tool element such as, for example, middle plate 140 of FIG. 1, with a number of relatively less expensive die seals sized for a variety of different semiconductor die sizes, resulting in reduced manufacturing costs. In a representative embodiment of the present invention, the raised portion of the die seal, illustrated in FIG. 7B by the raised sealing surface 723, may extend beyond each edge of the semiconductor die by an amount in a range of about 1 mm to about 3 mm. In this manner, the geometry of the mold material near the semiconductor die may be controlled, optimizing the stresses at the side faces of the semiconductor die, while reducing the cost of the tools used for packaging.

FIG. 8 illustrates a cross section view of an exemplary die seal 820, and a mold tool element 840 such as, for example, the middle layer 140 of FIG. 1, in accordance with a representative embodiment of the present invention. As shown in the illustration of FIG. 8, the die seal 820 includes a generally flat raised sealing surface 823, the boundary of which is defined by a step or transition portion 822 that separates the raised sealing surface 823 from the generally flat area of the die seal 820 surrounding the step or transition portion 822 and the raised sealing surface 823. The dimensions of the raised sealing surface 823 of FIG. 8 have been chosen according to the size of the semiconductor die for which the die seal 820 has been fabricated and/or the dimensions of the groove in the mold material surrounding such die. In the example of FIG. 8, the raised sealing surface 823 defined by the step or transition portion 822 occupies nearly the entire lower surface of the die seal 820.

FIG. 9 illustrates a cross section view of another exemplary die seal 920, and a mold tool element 940 that may correspond to, for example, the mold tool element 840 of FIG. 8, in accordance with a representative embodiment of the present invention. As illustrated in FIG. 9, the exemplary die seal 920 includes a generally flat raised sealing surface 923, the boundary of which is defined by a step or transition portion 922 that separates the raised sealing surface 923 from the generally flat area of the die seal 920 surrounding the step or transition portion 922 and the raised sealing surface 923. As in FIG. 8, the dimensions of the raised sealing surface 923 of FIG. 9 have been chosen according to the size of the semiconductor die for which the die seal 920 has been fabricated and/or the dimensions of the groove in the mold material surrounding such die. In the example of FIG. 9, the raised sealing surface 923 defined by the step or transition portion 922 occupies a relatively smaller portion of the lower surface of the die seal 920 compared to that of the raised sealing surface 823 of the die seal 820 of FIG. 8. The outline and outer dimensions of the upper portion of the die seal 920 (i.e., the geometry of that portion of the die seal 920 not a part of the raised sealing surface defined or bounded by the step or transition portion 922) that is in contact with the mold tool element 940, however, is the same as the geometry of the upper portion of die seal 820 of FIG. 8.

FIG. 10 illustrates a cross section view of yet another exemplary die seal 1020 and a mold tool element 1040 that may correspond to, for example, the mold tool elements 840, 940 of FIG. 8 and FIG. 9, respectively, in accordance with a representative embodiment of the present invention. As shown in FIG. 10, the exemplary die seal 1020 includes a generally flat raised sealing surface 1023 bounded by a step or transition portion 1022 that separates the raised sealing surface 1023 from the generally flat area of the die seal 1020 surrounding the step or transition portion 1022 and the raised sealing surface 1023. The dimensions of the raised sealing surface 1023 of FIG. 10 correspond to the size of the semiconductor die for which the die seal 1020 has been created. In the example of FIG. 10, the raised sealing surface 1023 defined by the step or transition portion 1022 occupies an even smaller portion of the lower surface of the die seal 1020 compared to that of the raised sealing surface 823, 923 of the die seals 820, 920 of FIG. 8 and FIG. 9, respectively. The outline and outer dimensions of the upper portion of the die seal 1020 (i.e., the geometry of that part of the die seal 1020 not part of the raised sealing surface defined or bounded by the step or transition portion 1022) that is in contact with the mold tool element 1040, however, is the same as the geometry of the upper portion of die seals 820, 920 of FIG. 8 and FIG. 9, respectively.

Figure 11:
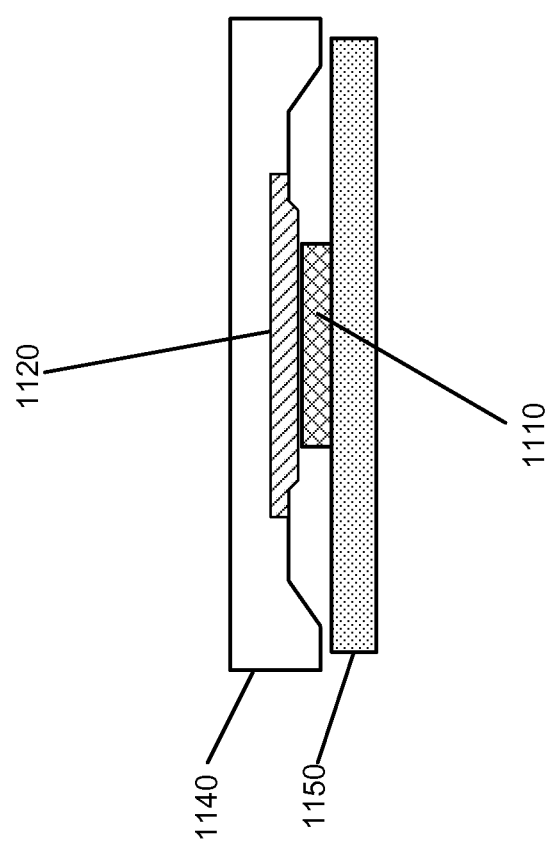
FIG. 11 illustrates a cross section view of an exemplary die seal, and a mold tool element that may correspond to, for example, the middle layers depicted in FIG. 1, 8, 9, or 10, in which the die seal is positioned over a semiconductor die attached to a substrate, in accordance with a representative embodiment of the present invention.

FIG. 11 illustrates a cross section view of an exemplary die seal 1120, and a mold tool element 1140 that may correspond to, for example, the middle layers 140, 840, 940, 1040 depicted in FIG. 1, 8, 9, or 10, respectively, in which the die seal 1120 is positioned over a semiconductor die 1110 attached to a substrate 1150, in accordance with a representative embodiment of the present invention. The substrate 1150 and the semiconductor die 1110 may correspond to, for example, the substrate 150 and the semiconductor die 110 of FIG. 1, respectively. The elements corresponding to the upper chase 130 and lower chase 160 shown in FIG. 1 have been omitted from FIG. 11, solely for reasons of clarity. As shown in the illustration of FIG. 11, the substrate 1150 with attached semiconductor die 1110 has been placed within the elements of a mold tool such as the mold tool 100 of FIG. 1, for example. In the illustration of FIG. 11, the pressure used to clamp the substrate 1150 between the mold tool elements above the substrate 1150 such as, for example, the upper chase 130 and middle layer 140 of FIG. 1, and the mold tool elements located below the substrate 1150 such as, for example, the lower chase 160 of FIG. 1, has not yet been applied.

Figure 12:
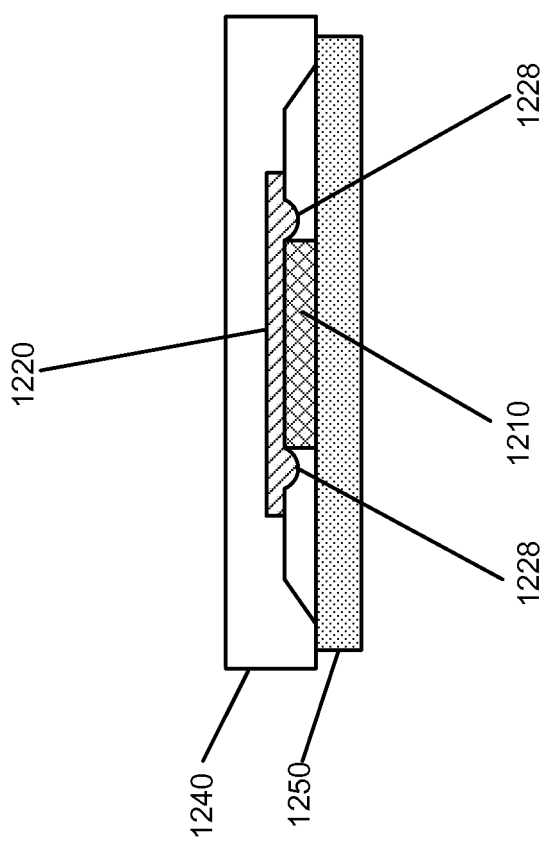
FIG. 12 illustrates a cross section view of an exemplary die seal that may correspond to, for example, the die seal of FIG. 11, and a mold tool element that may correspond to, for example, the middle layer depicted in FIG. 1, after the application of pressure upon the mold tool element sufficient to cause deformation of the die seal, in accordance with a representative embodiment of the present invention.

FIG. 12 illustrates a cross section view of an exemplary die seal 1220 that may correspond to, for example, the die seal 1120 of FIG. 11, and a mold tool element 1240 that may correspond to, for example, the middle layer 140 depicted in FIG. 1, after the application of pressure upon the mold tool element 1240 sufficient to cause deformation of the die seal 1220, in accordance with a representative embodiment of the present invention. In a representative embodiment of the present invention, the amount of pressure applied to the die seal to cause the desired deformation of the die seal may, for example, be approximately 5 kilograms/centimeter², and is preferably adjusted to create an adequate seal around the perimeter of the semiconductor die. The amount of pressure needed to create an adequate seal may be defined as a pressure that is within a range of pressures that are high enough to avoid the presence of mold flash on the top surface of the semiconductor die, yet low enough to avoid any damage to die bumps used to mount the die to a substrate. In order to use one die seal for a range of sizes of semiconductor die, the pressure applied to the mold tool may be adjusted during a set-up process for the mold tool, and preferably results in a groove depth in the range of about 50 μm to about 300 μm.

In addition to the mold tool element 1240 and the die seal 1220, FIG. 12 also shows a substrate 1250 and a semiconductor die 1210, which may correspond to, for example, the substrate 1150 and semiconductor die 1110 of FIG. 11, respectively. As illustrated in FIG. 12, the application of sufficient force upon the mold tool element 1240 in the direction of the substrate 1250 causes the flexible material of the die seal 1220 to deform, producing concave bulges 1228 that protrude into the cavity formed by the mold tool element 1240, the substrate 1250, and the semiconductor die 1210. In accordance with a representative embodiment of the present invention, the bulges 1228 border the side faces of the semiconductor die 1210, as described above.

Figure 13:
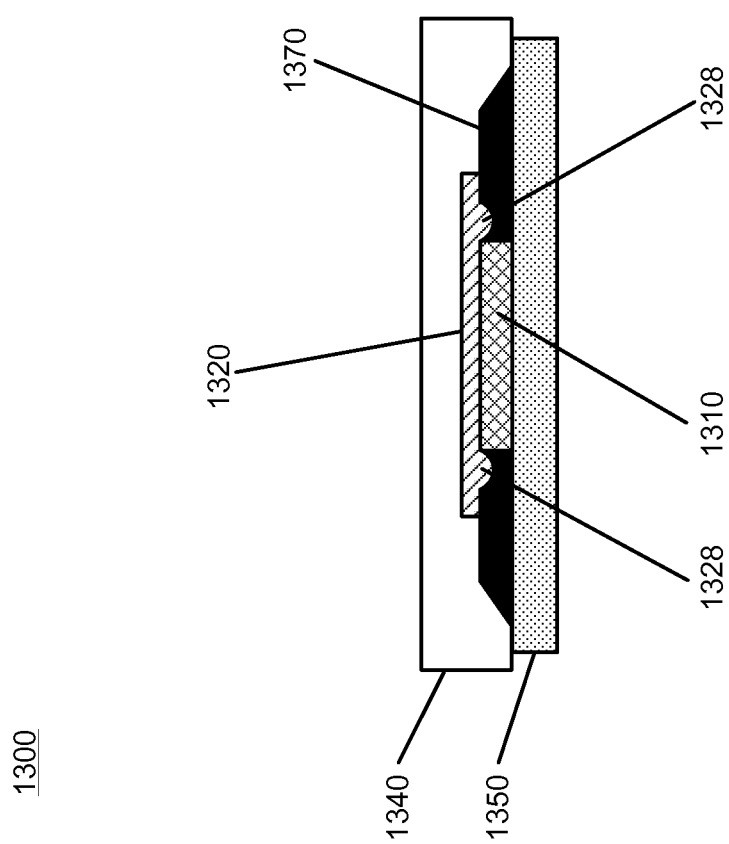
FIG. 13 illustrates a cross section view of still another exemplary die seal, and a mold tool element that may correspond, for example, to the middle layer depicted in FIG. 1, after the injection of mold material, in accordance with a representative embodiment of the present invention.

FIG. 13 illustrates a cross section view of still another exemplary die seal 1320, and a mold tool element 1340 that may correspond, for example, to the middle layer 140 depicted in FIG. 1, after the injection of mold material 1370, in accordance with a representative embodiment of the present invention. In addition to the mold tool element 1340, the die seal 1320, and the mold material 1370, the illustration of FIG. 13 also includes a substrate 1350 and a semiconductor die 1310 that may correspond to, for example, the substrate 1250 and the semiconductor die 1210 of FIG. 12, respectively. As described above with respect to the similarly named elements of FIG. 12, a cavity or void is formed by the mold tool element 1340, the substrate 1350, and the semiconductor die 1310 upon the application of pressure upon the mold tool element 1340 in the direction of the substrate 1350, causing the formation of bulges 1328. While pressure is applied, mold material is injected into the cavity through a mold gate (not illustrated in FIG. 13) such as, for example, the elements of the mold gate 133, 143 located in the upper chase 130 and the middle layer 140 of FIG. 1, respectively. As can be seen in FIG. 13, the bulges 1328 bordering the side faces of the semiconductor die 1310 restrict or direct the flow of the injected mold material 1370, as described above. The geometry of the mold material 1370 in the region near the side faces of the semiconductor die 1310 that results from the presence of the bulges 1328 reduces the tensile and shear forces created by differences in the coefficients of thermal expansion of the semiconductor die 1310 and the mold material 1370, which provides benefits of reduced cracking of the semiconductor die 1310, improved yields, and reduced cost to manufacture.

Figure 14:
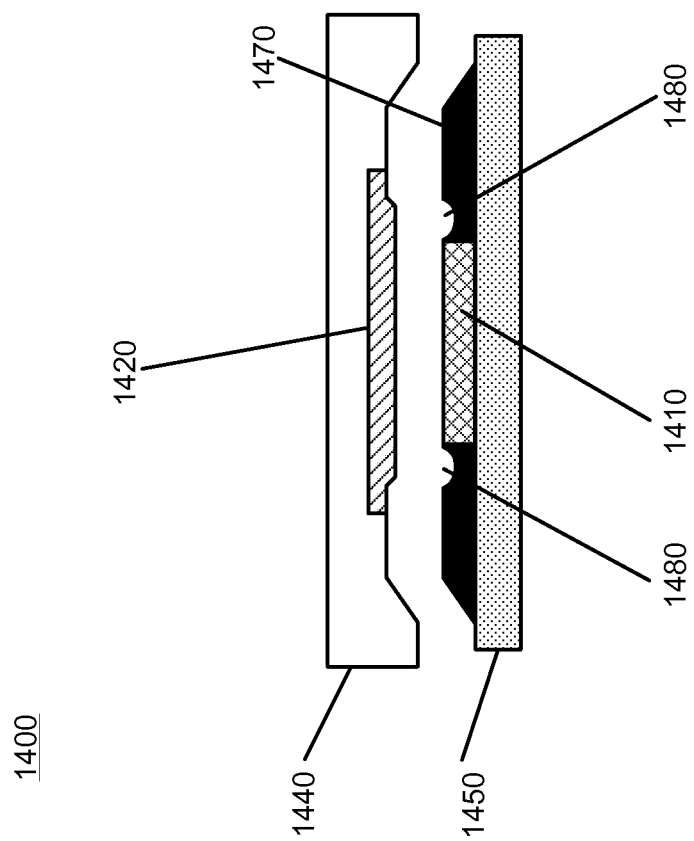
FIG. 14 illustrates a cross section view of yet an exemplary die seal and mold tool element that may correspond, for example, to the die seal and the mold tool element depicted in FIG. 13, after release of pressure and withdrawal of the mold tool element and the die seal from the injected mold material covering a semiconductor die and a substrate, in accordance with a representative embodiment of the present invention.

FIG. 14 illustrates a cross section view of yet another exemplary die seal 1420 and mold tool element 1440 that may correspond, for example, to the die seal 1320 and the mold tool element 1340 depicted in FIG. 13, after release of pressure and withdrawal of the mold tool element 1440 and the die seal 1420 from the injected mold material 1470 covering a semiconductor die 1410 and a substrate 1450, in accordance with a representative embodiment of the present invention. The substrate 1450 and the semiconductor die 1410 may correspond to, for example, the substrate 1350 and the semiconductor die 1310 of FIG. 13, respectively. As described above with respect to FIG. 13, the geometry of the mold material 1470 previously injected into the cavity formed by the mold tool element 1340, substrate 1350, and semiconductor die 1310, is seen as grooves 1480 in the mold material 1470 in the region of the side faces of the semiconductor die 1410 caused by bulges in the die seal 1420. As can be seen in FIG. 14, the release of pressure upon the mold tool element 1440 and the die seal 1420 returns the die seal 1420 to its resting shape, without the bulges 1328 that appear in FIG. 13, leaving the grooves 1480 that border the side faces of the semiconductor die 1410. The geometry of the grooves 1480 in the mold material 1470 results in reduced tensile and shear forces due to differences in the coefficients of thermal expansion of the semiconductor die 1410 and the mold material 1470 in the region of the side faces of the semiconductor die 1410. The geometry of the mold material 1470 in a representative embodiment of the present invention results in reduced cracking of the semiconductor die 1410, improved yields, and reduced cost to manufacture.

Figure 15:
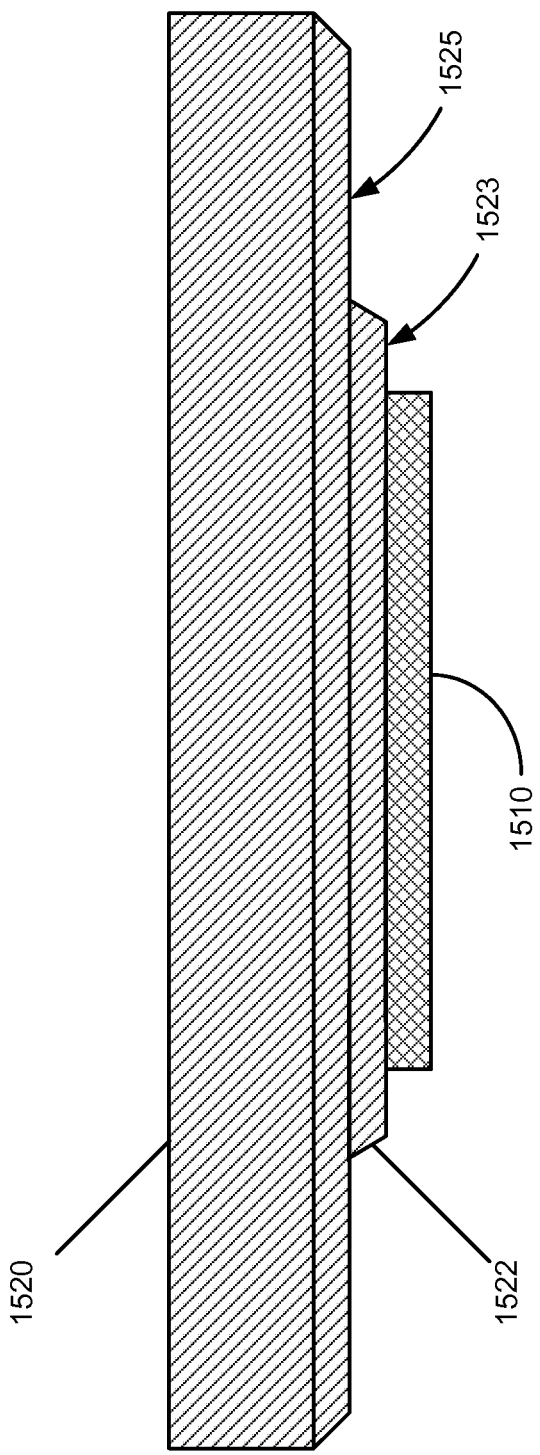
FIG. 15 is a side view of an exemplary die seal having a transition portion that defines a raised portion of the lower seal surface of the die seal, shown in FIG. 15 as the raised seal surface, which covers the upper surface of a semiconductor die, in accordance with a representative embodiment of the present invention.

FIG. 15 is a side view of an exemplary die seal 1520 having a step or transition portion 1522 that defines a raised portion of the lower seal surface 1525 of the die seal 1520, shown in FIG. 15 as the raised seal surface 1523, which covers the upper surface of a semiconductor die 1510, in accordance with a representative embodiment of the present invention. As shown in FIG. 15, the generally flat raised seal surface 1523 extends beyond the upper surface of the semiconductor die 1510, in accordance with a representative embodiment of the present invention.

Figure 16:
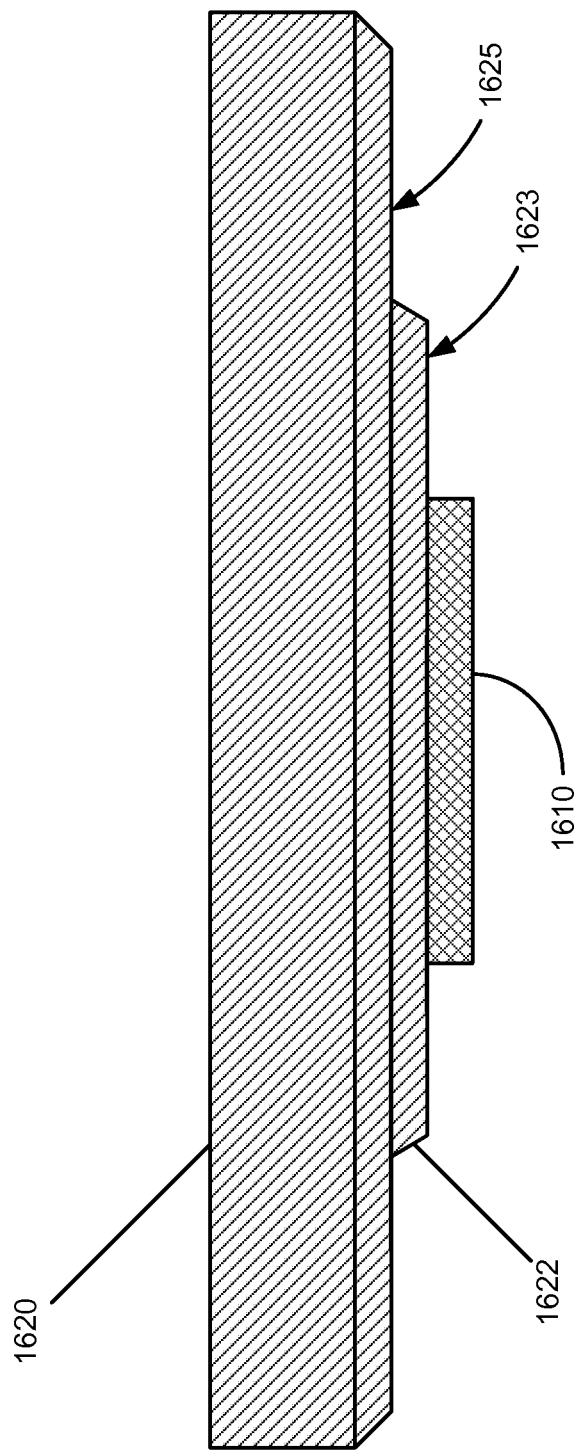
FIG. 16 is a side view of another exemplary die seal having a transition portion that defines a raised seal surface, in which the raised seal surface covers the upper surface of a semiconductor die having dimensions smaller than that of the semiconductor die of FIG. 15, in accordance with a representative embodiment of the present invention.

FIG. 16 is a side view of another exemplary die seal 1620 having a step or transition portion 1622 that defines a raised seal surface 1623, in which the raised seal surface 1623 covers the upper surface of a semiconductor die 1610 having dimensions smaller than that of the semiconductor die 1510 of FIG. 15, in accordance with a representative embodiment of the present invention. As shown in FIG. 16, the generally flat raised seal surface 1623, while the same size as the raised seal surface 1523 of die seal 1520, extends beyond the upper surface of the semiconductor die 1610 to a greater extent than the die seal 1520 extends beyond the upper surface of the semiconductor die 1510. The die seal 1620 having the raised seal surface 1623, however, is still suitable for protecting the die seal 1610 from mold flash, and producing the desired geometry in the mold material near the sides of the semiconductor die 1610 that results in the desired reduction in stresses at the die-to-mold material interface, in accordance with a representative embodiment of the present invention.

Figure 17:
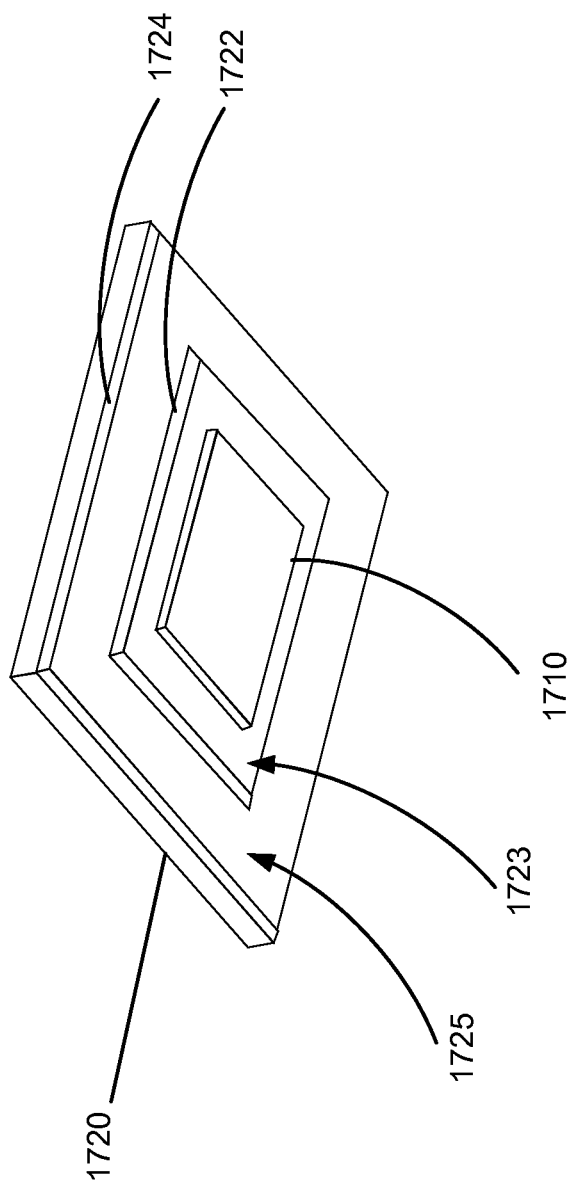
FIG. 17 is a perspective view of the underside of an exemplary die seal in relation to a suitably sized semiconductor die, which may correspond to, for example, the die seals and the semiconductor die of FIGS. 15 and 16, in accordance with a representative embodiment of the present invention.

FIG. 17 is a perspective view of the underside of an exemplary die seal 1720 in relation to a suitably sized semiconductor die 1710, which may correspond to, for example, the die seals 1520, 1620 and the semiconductor die 1510, 1610 of FIGS. 15 and 16, respectively, in accordance with a representative embodiment of the present invention. In addition to the semiconductor die 1710 and the die seal 1720, FIG. 17 also illustrates a step or transition portion 1722 that defines, separates, or bounds a generally flat raised seal surface 1723 from a lower seal surface 1725 of the die seal 1720. In the illustration of FIG. 17, the lower surface of the semiconductor die 1710 is visible, while the upper surface of the semiconductor die 1710 is covered by the generally flat raised seal surface 1723 of the die seal 1720. The illustration of FIG. 17 also includes a chamfer 1724, which may be used in some representative embodiments to aid in retaining the die seal 1720 within an opening, recess, or pocket in a mold tool element such as, for example, the middle layer 140 of the mold tool 100 of FIG. 1. It should again be noted that the chamfer 1724, and this particular approach to securing the die seal 1720 to one or more elements of a mold tool do not necessarily represent specific limitations of a representative embodiment of the present invention, for example unless explicitly claimed, as other means may be used without departing from the spirit and scope of the present invention.

Figure 18:
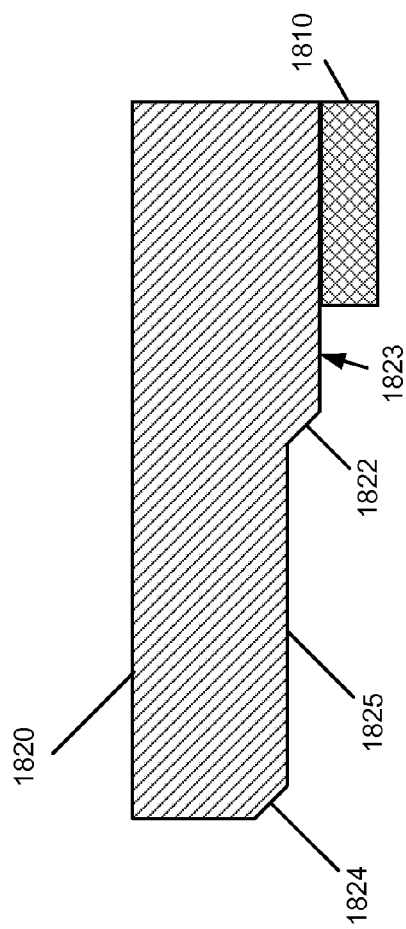
FIG. 18 shows a half-cross section view of an exemplary die seal covering the upper surface of a semiconductor die, prior to the application upon the die seal of sufficient pressure to suitably deform the die seal, in accordance with a representative embodiment of the present invention.

FIG. 18 shows a half-cross section view of an exemplary die seal 1820 covering the upper surface of a semiconductor die 1810, prior to the application upon the die seal 1820 of sufficient pressure to suitably deform the die seal 1820, in accordance with a representative embodiment of the present invention. The die seal 1820 shown in the illustration of FIG. 18 may correspond to, for example, one half of the cross sections of the die seals of FIGS. 8-14, described above. FIG. 18 shows the die seal 1820 including a lower seal surface 1825 and a raised seal surface 1823 that protrudes or projects from the lower seal surface 1823, and that is defined, separated, or bordered by a step or transition portion 1822, which may correspond to, for example, the lower seal surface 725 of FIGS. 7A and 7B. As illustrated in FIG. 18, the raised seal surface 1823 extends beyond the upper surface of the semiconductor die 1810. The die seal 1820 also includes a chamfer 1824, which may be used to retain or secure the die seal 1820 in a recess or pocket in a mold tool element such as, for example, the middle layer 140 of the mold tool 100 of FIG. 1, in some representative embodiments of the present invention. It should be again be noted that the chamfer 1824, and the use of a pocket or recess for retaining the die seal 1820 in a mold tool, do not necessarily represent specific limitations of a representative embodiment of the present invention, for example unless explicitly claimed, and that other means for securing or retaining the die seal 1820 within a mold tool may be employed without departing from the spirit or scope of the present invention.

Figure 19:
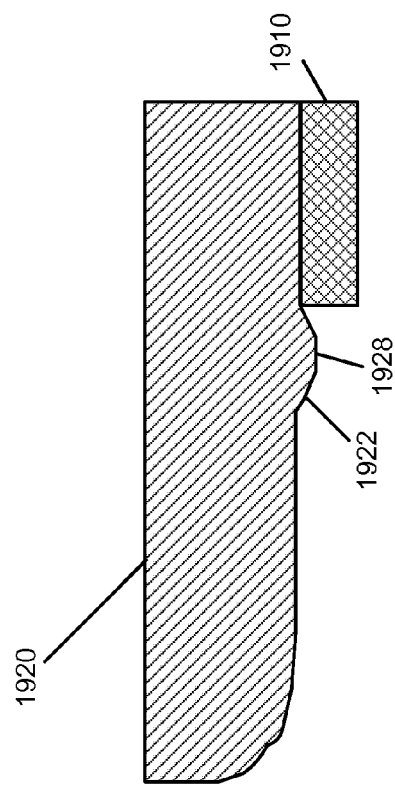
FIG. 19 shows a half-cross section view of an exemplary die seal that may correspond to, for example, the die seal of FIG. 18, following the application upon the die seal of sufficient pressure to deform the die seal to form concave protrusions or bulges in the region near the side faces of a semiconductor die, in accordance with a representative embodiment of the present invention.

FIG. 19 shows a half-cross section view of an exemplary die seal 1920 that may correspond to, for example, the die seal 1820 of FIG. 18, following the application upon the die seal 1920 of sufficient pressure to deform the die seal 1920 to form concave protrusions or bulges 1928 in the region near the side faces of a semiconductor die 1910, in accordance with a representative embodiment of the present invention. The die seal 1920 shown in the illustration of FIG. 19 may correspond to, for example, one half of the cross sections of the die seals of FIGS. 8-14, described above, and the semiconductor die 1910 may correspond to, for example, the semiconductor die 1810 of FIG. 18. The illustration of FIG. 19 represents the deformation under pressure of the die seal 1920 predicted by analysis using a finite element model. As shown in FIG. 19, the force applied to the upper surface of the die seal 1920 deforms or distorts the die seal 1920 and, in particular, causes the geometry of the portion of the raised seal surface 1823 that extends beyond the upper surface of the semiconductor die 1910, and the step or transition portion 1922, to form a concave portion or bulge 1928 that borders the side faces of the semiconductor die 1910. As described above with respect to the deformation of die seals in FIGS. 11-14, the bulge 1928 acts to guide or control the flow of mold material into the area where the mold material makes contact with the side face of the semiconductor die 1910, resulting in the formation of a groove in the mold material shown, for example, as the grooves 1480 in FIG. 14. The die seal 1920 also includes a chamfer 1924, which may be used to retain or secure the die seal 1920 in a recess or pocket in a mold tool element such as, for example, the middle layer 140 of the mold tool 100 of FIG. 1, in some representative embodiments of the present invention. It should again be noted that the chamfer 1924, and the use of a pocket or recess for retaining the die seal 1920 in a mold tool, do not necessarily represent specific limitations of a representative embodiment of the present invention, for example unless explicitly claimed, and that other means for securing or retaining the die seal 1920 within a mold tool may be employed without departing from the spirit or scope of the present invention.

FIG. 20 is a flowchart illustrating an exemplary method of applying mold material to a semiconductor die of an electrical circuit, in accordance with a representative embodiment of the present invention. As shown in FIG. 20, the method begins at block 2010, where an electrical circuit comprising a semiconductor die is placed in a mold tool such as, for example, the mold tool 100 described above with respect to FIG. 1, which may be assembled to use a die seal such as, for example, any of those described above with respect to FIGS. 7-19. It should be noted that although mention is made here, and the illustrations of some of the figures relate to placing what is shown as a single electrical circuit in a single mold tool, such a mold tool may, in fact, have a number of mold cavities, where each mold cavity is capable of being used for the application of mold material to a separate electrical circuit in the manner described herein, without departing from the spirit and scope of the present invention. Also, as discussed previously with regard to FIG. 1, a plurality of die may be molded in a single cavity as a single system-in-package, a plurality of die may be molded in a single cavity for later excising into respective molded packages, etc.

Next, at block 2020, the method of FIG. 20 places a flexible die seal in accordance with a representative embodiment of the present invention upon a surface of the semiconductor die of the electrical circuit. The die seal used may be, for example, any of those described above with respect to FIGS. 7-19. Then, at block 2030, the method of FIG. 20, while maintaining pressure upon the die seal and mold tool elements, covers at least a portion of the semiconductor die of the electrical circuit with mold material that forms a groove defined by the die seal. The groove in the mold material formed in this manner may, for example, take any of the shapes described above with respect to FIGS. 7-19, but is not so limited, as FIGS. 7-19 are offered as merely illustrative of examples of representative embodiments of the present invention. Next, at block 2040, the method of FIG. 20 may release pressure from the die seal and mold tool elements, and the electrical circuit may be removed from the mold tool. It should be noted that although the flowchart of FIG. 20 illustrates a single pass that produces a single electrical circuit, it will be recognized that the method may be repeated, as needed, to produce whatever quantity is desired.

Aspects of the present invention may be seen in an integrated circuit produced by the process illustrated in FIG. 20 and discussed above. For example, the integrated circuit may comprise features (e.g., mold grooves) formed by utilization of any of the die seal characteristics discussed herein.

Aspects of the present invention may be seen in an electrical circuit prepared by a process comprising placing a semiconductor die in a mold tool, where the semiconductor die may comprise a first die surface, a second die surface generally parallel to the first die surface, and a plurality of die faces, each die face connecting an edge of the first die surface with a corresponding edge of the second die surface to define a die thickness. The method may also comprise placing a flexible die seal upon the first die surface, and while pressing the die seal against the first die surface of the semiconductor die, applying mold material to at least a portion of the semiconductor die. The die seal may comprise a first seal surface having a generally planar first area for covering the first die surface during said applying mold material. The first area may have a plurality of edges, and each edge of the first area may have a portion extending beyond a corresponding edge of the first die surface. The first seal surface may also have a generally planar second area surrounding the first area, where the first area may be raised above the second area. The die seal may also comprise a second seal surface for securing the die seal to an element of the mold tool.

In various representative embodiment of the present invention, the first die surface may be rectangular, and the first area may be separated from the second area by a sloped transition portion. The die seal may comprise a silicon rubber, and the die seal may comprise a material that has a Shore A durometer measurement in the range of about 30 to about 60. In some representative embodiments of the present invention, the pressure applied to the die seal during said applying mold material to at least a portion of the semiconductor die may be sufficient to cause each portion of the die seal that extends beyond an edge of the first die surface to form a bulge that borders the corresponding edge of the semiconductor die. The pressure applied to the die seal may deform the die seal to cause at least a portion of the bulge at least 100 microns below the plane of the first die surface. The portion of the edge of the first area may extend beyond a corresponding edge of the first die surface in the range of about 1 millimeter to about 3 millimeters.

Further aspects of the present invention may be found in an electrical circuit prepared by a process comprising placing a first seal surface of a flexible die seal upon a first die surface of a semiconductor die, the semiconductor die comprising a first die surface, a second die surface generally parallel to the first die surface, and a plurality of die faces, each die face connecting an edge of the first die surface with a corresponding edge of the second die surface. Such a process may also comprise while pressing the die seal against the first die surface of the semiconductor die, applying mold material to at least a portion of the semiconductor die. The first seal surface may comprise a generally planar first area for covering the first die surface during said applying mold material, the first area having a plurality of edges, each edge of the first area having a portion extending beyond a corresponding edge of the first die surface, and a generally planar second area surrounding the first area, wherein the first area is raised above the second area.

In some representative embodiments of the present invention, the first die surface may be rectangular, the first area may be separated from the second area by a sloped transition portion, and/or the die seal may comprise a silicon rubber. The die seal may comprise a material that has a Shore A durometer measurement in the range of about 30 to about 60. The pressure applied to the die seal during said applying mold material to at least a portion of the semiconductor die may be sufficient to cause each portion of the die seal that extends beyond an edge of the first die surface to form a bulge that borders the corresponding edge of the semiconductor die. Further, the portion of the edge of the first area may extend beyond a corresponding edge of the first die surface in the range of about 1 millimeter to about 3 millimeters.

Additional aspects of the present invention may be observed in a die seal for protecting a surface of a semiconductor die during application of mold material to at least a portion of the semiconductor die. The semiconductor die may comprise a first die surface, a second die surface generally parallel to the first die surface, and a plurality of die faces, each die face connecting an edge of the first die surface with a corresponding edge of the second die surface to define a die thickness. The die seal may comprise a first seal surface having a generally planar first area for covering the first die surface during said application of said mold material. The first area may have a plurality of edges, and each edge of the first area may extend beyond a corresponding edge of the first die surface. The first seal surface may also have a generally planar second area surrounding the first area, where the first area may be raised above the second area. The die seal may also comprise a second seal surface for securing the die seal to an element of a mold tool.

In various representative embodiments of the present invention, the first die surface may be rectangular, and the first area may be separated from the second area by a sloped transition portion. The die seal may comprise a silicon rubber, and the portion of the edge of the first area may extend beyond a corresponding edge of the first die surface in the range of about 1 millimeter to about 3 millimeters.

The step or transition portion of representative embodiments of the present invention may comprise a specific geometry that forms the correct groove width and depth around a particular die size, and in addition, may create a continuous and smooth transformation between the die seal material and the surface of the middle plate element of a mold tool. A representative embodiment of the present invention provides a relatively simple and low cost solution that allows coverage of a wide range of die sizes by changing out the die seal itself, and reuse of the middle chase of the mold tool. Important aspects of a representative embodiment of the present invention includes the use of an oversized die seal that is dimensioned to accommodate the largest die size possible for the associated substrate size, and a step or transition portion on the die seal surface that contacts the semiconductor die, that create a suitable undercut groove geometry, in both width and depth. In a representative embodiment of the present invention, the die seal may be molded. Therefore, the die seal may be designed and manufactured to create a 3-dimensional contour that provides both a step or transition portion of the appropriate size to create the desired undercut groove geometry, and a continuation of the surface of the cavity of the mold tool.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for producing an electrical circuit, the method comprising:
   placing a semiconductor die in a mold tool, the semiconductor die comprising a first die surface, a second die surface generally parallel to the first die surface, and a plurality of die faces, each die face connecting an edge of the first die surface with a corresponding edge of the second die surface to define a die thickness;
   placing a flexible die seal upon the first die surface; and
   while pressing the die seal against an entirety of the first die surface of the semiconductor die, applying mold material to at least a portion of the semiconductor die;
   wherein the die seal comprises:
      a first seal surface having a generally planar first area for covering the entirety of the first die surface during said applying mold material,
      the first area having a plurality of edges forming a perimeter of the first area, each of the plurality of edges of the first area extending beyond a corresponding edge of the first die surface such that the first area of the first seal surface is larger than the first die surface,
      the first seal surface also having a generally planar second area surrounding the first area, wherein the first area and second area are not in a same plane; and
      a second seal surface for securing the die seal to an element of the mold tool.

2. The method of claim 1, wherein the first die surface is rectangular and the second die surface is attached to a substrate.

3. The method of claim 1, wherein the first area is separated from the second area by a sloped transition portion.

4. The method of claim 1, wherein the die seal comprises a silicon rubber.

5. The method of claim 1, wherein the die seal comprises a material that has a Shore A durometer measurement in the range of about 30 to about 60.

6. The method of claim 1, wherein pressure applied to the die seal during said applying mold material to at least a portion of the semiconductor die is sufficient to cause the first seal surface of the die seal to form a bulge that borders each edge of the first die surface.

7. The method of claim 6, wherein the pressure applied to the die seal deforms the die seal to cause at least a portion of the bulge to extend to at least 100 microns below the first die surface.

8. The method of claim 1, wherein each edge of the first area of the die seal extends beyond its corresponding edge of the first die surface in a range of about 1 millimeter to about 3 millimeters.

9. A method for producing an electrical circuit, the method comprising:
   placing a first seal surface of a flexible die seal upon a first die surface of a semiconductor die, the semiconductor die comprising a first die surface, a second die surface generally parallel to the first die surface, and a plurality of die faces, each die face connecting an edge of the first die surface with a corresponding edge of the second die surface; and
   while pressing the die seal against an entirety of the first die surface of the semiconductor die, applying mold material to at least a portion of the semiconductor die, such that pressure applied to the die seal during said applying mold material is sufficient to cause the first seal surface of the die seal to form a bulge that borders each edge of the first die surface;
   wherein the first seal surface comprises:
      a generally planar first area for covering the entirety of the first die surface during said applying mold material, the first area having a plurality of edges forming a perimeter of the first area, each of the plurality of edges of the first area extending beyond a corresponding edge of the first die surface such that the first area of the first seal surface is larger than the first die surface; and
      a generally planar second area surrounding the first area, wherein the first area and second area are not in a same plane.

10. The method of claim 9, wherein the first die surface is rectangular and the second die surface is attached to a substrate.

11. The method of claim 9, wherein the first area is separated from the second area by a sloped transition portion.

12. The method of claim 9, wherein the die seal comprises a silicon rubber.

13. The method of claim 9, wherein the die seal comprises a material that has a Shore A durometer measurement in the range of about 30 to about 60.

14. The method of claim 9, wherein the pressure applied to the die seal deforms the die seal to cause at least a portion of the bulge to extend at least 100 microns below the first die surface.

15. The method of claim 9, wherein the each edge of the first area extends beyond its corresponding edge of the first die surface in a range of about 1 millimeter to about 3 millimeters.

16. A system for producing an electrical circuit, the system comprising:
- a mold tool for receiving a semiconductor die, the semiconductor die comprising a first die surface, a second die surface generally parallel to the first die surface, and a plurality of die faces, each die face connecting an edge of the first die surface with a corresponding edge of the second die surface to define a die thickness;
- a flexible die seal that is operable to press against an entirety of the first die surface to define a cavity that enables application of a mold material to at least a portion of the semiconductor die;
- wherein the die seal comprises:
  - a first seal surface having a generally planar first area for covering an entirety of the first die surface during said application of mold material,
  - the first area having a plurality of edges forming a perimeter of the first area, each of the plurality of edges of the first area having a portion extending beyond a corresponding edge of the first die surface such that the first area of the first seal surface is larger than the first die surface,
  - the first seal surface also having a generally planar second area surrounding the first area, wherein the first area and the second area are not in a same plane;
  - and
  - a second seal surface for securing the die seal to an element of the mold tool.

17. The system according to claim 16, wherein the first area is separated from the second area by a sloped transition portion.

18. The system according to claim 16, wherein the die seal comprises a silicon rubber.

19. The system according to claim 16, wherein:
- the first seal surface is configured to form a bulge that borders each edge of the semiconductor die when the die seal is pressed by the mold tool against the entirety of the first die surface.

20. The system according to claim 19, wherein the pressure applied to the die seal deforms the die seal to cause at least a portion of the bulge to extend to at least 100 microns below the first die surface.

* * * * *